(12) United States Patent
Weidner et al.

(10) Patent No.: US 9,490,396 B2
(45) Date of Patent: Nov. 8, 2016

(54) OPTOELECTRONIC SEMICONDUCTOR COMPONENT

(71) Applicant: OSRAM Opto Semiconductors GmbH, Regensburg (DE)

(72) Inventors: Karl Weidner, München (DE); Ralph Wirth, Lappersdorf (DE); Axel Kaltenbacher, Ingolstadt (DE); Walter Wegleiter, Nittendorf (DE); Bernd Barchmann, Regensburg (DE); Oliver Wutz, Regensburg (DE); Jan Marfeld, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/931,246

(22) Filed: Nov. 3, 2015

(65) Prior Publication Data

US 2016/0056343 A1 Feb. 25, 2016

Related U.S. Application Data

(62) Division of application No. 14/223,173, filed on Mar. 24, 2014, now Pat. No. 9,209,328, which is a division of application No. 13/320,304, filed as application No. PCT/EP2010/060434 on Jul. 19, 2010, now Pat. No. 8,723,192.

(30) Foreign Application Priority Data

Aug. 7, 2009 (DE) .................. 10 2009 036 621

(51) Int. Cl.
*H01L 29/18* (2006.01)
*H01L 33/48* (2010.01)
(Continued)

(52) U.S. Cl.
CPC ......... *H01L 33/483* (2013.01); *H01L 23/3107* (2013.01); *H01L 31/0203* (2013.01);
(Continued)

(58) Field of Classification Search
CPC ... H01L 33/62; H01L 2924/00; H01L 33/60; H01L 2924/0002; H01L 2224/48091
USPC ...................... 257/88, 98, E33.068
See application file for complete search history.

(56) References Cited

U.S. PATENT DOCUMENTS 6,749,476 B2 6/2004 Chang
6,777,070 B1 8/2004 Murata et al.
(Continued)

FOREIGN PATENT DOCUMENTS

DE 102 45 930 4/2004
DE 10 2004 047 061 A1 4/2006
(Continued)

OTHER PUBLICATIONS

English translation of the Notification of Reasons for Rejection dated Dec. 2, 2014 corresponding to Japanese Patent Application No. 2012-523272.

(Continued)

*Primary Examiner* — Andy Huynh
(74) *Attorney, Agent, or Firm* — DLA Piper LLP (US)

(57) ABSTRACT

An optoelectronic semiconductor component includes an optoelectronic semiconductor chip having side areas, a surface at a top side of the semiconductor chip, and a surface at a bottom side of the semiconductor chip; a shaped body having a surface at a top side of the shaped body and a surface at an underside of the shaped body; at least one plated-through hole including an electrically conductive material; and an electrically conductive connection electrically conductively connected to the semiconductor chip and the plated-through hole, wherein the side areas of the optoelectronic semiconductor chip are covered by the shaped body, and the surface at the top side and/or the surface at the bottom side of the optoelectronic semiconductor chip are completely free of the shaped body.

14 Claims, 5 Drawing Sheets

(51) Int. Cl.
*H01L 33/62* (2010.01)
*H01L 31/0232* (2014.01)
*H01L 33/60* (2010.01)
*H01L 31/0203* (2014.01)
*H01L 33/56* (2010.01)
*H01L 23/31* (2006.01)
*H01L 33/54* (2010.01)

(52) U.S. Cl.
CPC ..... *H01L31/0232* (2013.01); *H01L 31/02327* (2013.01); *H01L 33/486* (2013.01); *H01L 33/56* (2013.01); *H01L 33/60* (2013.01); *H01L 33/62* (2013.01); *H01L 33/54* (2013.01); *H01L 2924/0002* (2013.01)

(56) References Cited

U.S. PATENT DOCUMENTS

| | | |
|---|---|---|
| 7,843,534 B2 | 11/2010 | Chang et al. |
| 8,097,894 B2 | 1/2012 | Bierhuizen et al. |
| 2005/0151147 A1 | 7/2005 | Izuno et al. |
| 2006/0097245 A1 | 5/2006 | Aanegola et al. |
| 2008/0036364 A1 | 2/2008 | Li et al. |
| 2008/0179611 A1 | 7/2008 | Chitnis et al. |
| 2008/0180606 A1 | 7/2008 | Chang et al. |
| 2008/0298601 A1 | 12/2008 | Rahbar |
| 2009/0309113 A1 | 12/2009 | Eichler et al. |
| 2010/0276706 A1 | 11/2010 | Herrmann |
| 2010/0320479 A1 | 12/2010 | Minato et al. |

FOREIGN PATENT DOCUMENTS

| | | |
|---|---|---|
| DE | 10 2007 030 129 A1 | 1/2009 |
| DE | 10 2011 080 458 A1 | 2/2013 |
| JP | 11-214754 A | 8/1999 |
| JP | 11-220180 A | 8/1999 |
| JP | 2000-124507 A | 4/2000 |
| JP | 2002-335020 A | 11/2002 |
| JP | 2003-007929 A | 1/2003 |
| JP | 2003-309293 | 10/2003 |
| JP | 2004-71895 | 3/2004 |
| JP | 2004-119743 | 4/2004 |
| JP | 2004-363380 | 12/2004 |
| JP | 2005-183777 | 7/2005 |
| JP | 2008-47832 | 2/2008 |
| JP | 2008-109156 | 5/2008 |
| JP | 2008-294224 | 12/2008 |
| JP | 2009-3442 | 1/2009 |
| JP | 2003-168762 A | 6/2013 |
| TW | 486709 | 5/2002 |
| TW | 503337 | 9/2002 |
| TW | 514757 | 12/2002 |
| TW | 527492 | 4/2003 |
| TW | 2005-01209 | 1/2005 |
| TW | I308307 B | 8/2008 |
| TW | 1308307 | 4/2009 |
| TW | 1354381 | 12/2011 |
| TW | I354381 B | 12/2011 |
| TW | 1392322 | 4/2013 |
| TW | I392322 B | 4/2013 |
| WO | 02/084749 A2 | 10/2002 |
| WO | 2008/115213 A2 | 9/2008 |
| WO | 2009/003442 A1 | 1/2009 |
| WO | 2009/003442 A2 | 1/2009 |
| WO | 2009/069671 A1 | 6/2009 |
| WO | 2009/075530 | 6/2009 |
| WO | 2009/075753 A2 | 6/2009 |

OTHER PUBLICATIONS

English translation of the Notice of Reasons for Rejection dated May 26, 2016, of corresponding Japanese Patent Application No. 2015-168164.

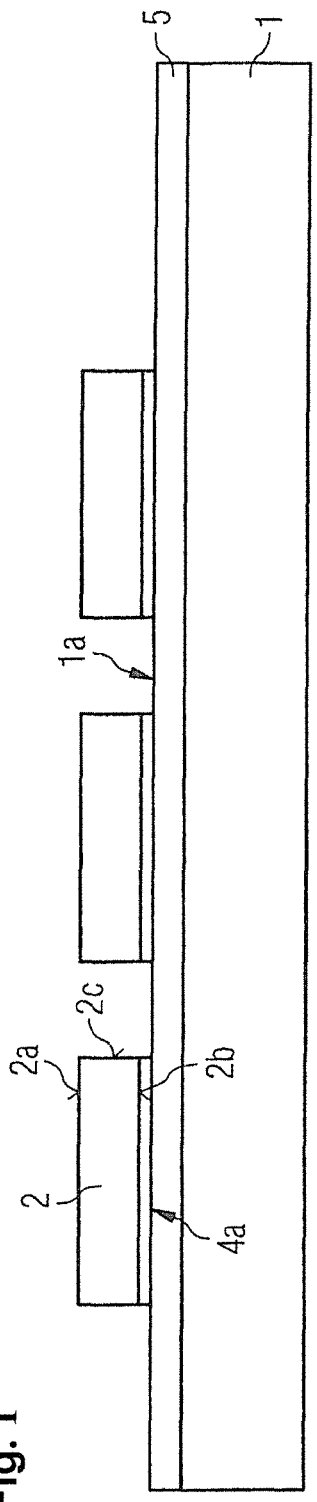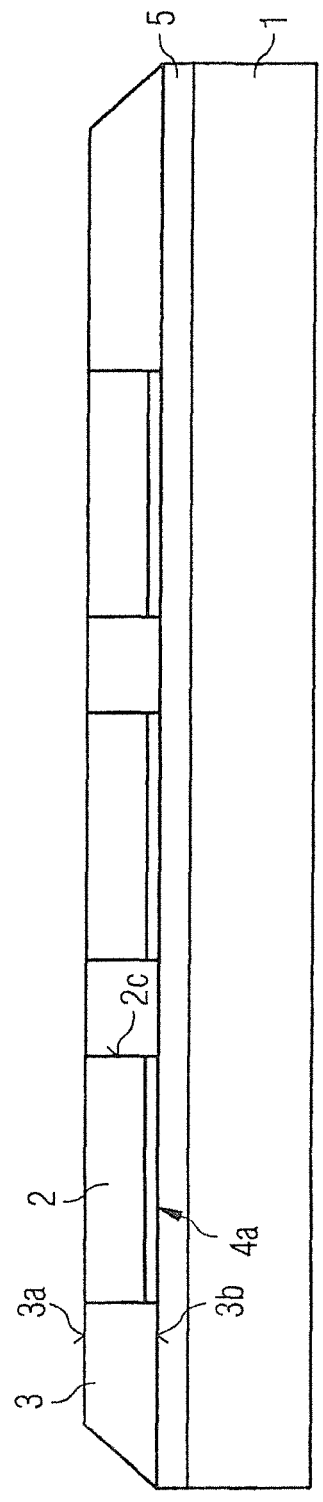

OPTOELECTRONIC SEMICONDUCTOR COMPONENT

RELATED APPLICATIONS

This application is a divisional of U.S. Ser. No. 14/223,173, filed Mar. 24, 2014, which is a divisional of U.S. Ser. No. 13/320,304, filed Jan. 23, 2012, which is a §371 of International Application No. PCT/EP2010/060434, with an international filing date of Jul. 19, 2010, which is based on German Patent Application No. 10 2009 036 621.0, filed Aug. 7, 2009.

TECHNICAL FIELD

This disclosure relates to methods of producing optoelectronic semiconductor components and optoelectronic semiconductor components made by the methods.

BACKGROUND

WO 2009/075753 A2 and WO 02/084749 each describe an optoelectronic semiconductor component.

However, it could be helpful to provide a simplified production method of producing optoelectronic semiconductor components and components produced thereby.

SUMMARY

We provide a method of producing an optoelectronic semiconductor component including providing a carrier, arranging at least one optoelectronic semiconductor chip at a top side of the carrier, shaping a shaped body around the at least one optoelectronic semiconductor chip, wherein the shaped body covers all side areas of the at least one optoelectronic semiconductor chip, and wherein a surface facing away from the carrier at the top side and/or a surface facing the carrier at an underside of the at least one semiconductor chip remains substantially free of the shaped body or is exposed, and removing the carrier.

We also provide an optoelectronic semiconductor component including an optoelectronic semiconductor chip having side areas covered by a shaped body, at least one plated-through hole including an electrically conductive material, and an electrically conductive connection electrically conductively connected to the semiconductor chip and the plated-through hole, wherein the plated-through hole is laterally spaced apart from the semiconductor chip, the plated-through hole completely penetrates through the shaped body, the plated-through hole extends from a top side of the shaped body to an underside of the shaped body, and the electrically conductive connection extends at the top side of the shaped body.

We further provide an optoelectronic semiconductor component including an optoelectronic semiconductor chip having side areas covered by a shaped body, and an electrically conductive connection electrically conductively connected to the semiconductor chip and the plated-through hole, wherein the plated-through hole is laterally spaced apart from the semiconductor chip, the plated-through hole completely penetrates through the shaped body, the plated-through hole extends from a top side of the shaped body to an underside of the shaped body, and the shaped body is optically reflective.

We further yet provide an optoelectronic semiconductor component including an optoelectronic semiconductor chip having side areas, a surface at a top side of the semiconductor chip, and a surface at a bottom side of the semiconductor chip; a shaped body having a surface at a top side of the shaped body and a surface at an underside of the shaped body; at least one plated-through hole including an electrically conductive material; and an electrically conductive connection electrically conductively connected to the semiconductor chip and the plated-through hole, wherein the side areas of the optoelectronic semiconductor chip are covered by the shaped body, and the surface at the top side and/or the surface at the bottom side of the optoelectronic semiconductor chip are completely free of the shaped body.

We also further provide an optoelectronic semiconductor component including an optoelectronic semiconductor chip having side areas, a surface at a top side of the semiconductor chip, and a surface at a bottom side of the semiconductor chip; a shaped body having a surface at a top side of the shaped body and a surface at an underside of the shaped body; at least one plated-through hole including an electrically conductive material; and an electrically conductive connection electrically conductively connected to the semiconductor chip and the plated-through hole, wherein the side areas of the optoelectronic semiconductor chip are covered by the shaped body, and the shaped body covers the side areas of the semiconductor chip up to a selected height such that the side areas of the semiconductor chip are free of the shaped boy in places or the surface at the top side and the surface at the underside of the shaped body terminates flush with the surface at the top side and the surface at the bottom side of the semiconductor chip, respectively.

We also further provide an optoelectronic semiconductor component including an optoelectronic semiconductor chip having side areas, a surface at a top side of the semiconductor chip, and a surface at a bottom side of the semiconductor chip; and a shaped body having a surface at a top side of the shaped body and a surface at an underside of the shaped body, wherein the side areas of the optoelectronic semiconductor chip are covered by the shaped body, and the surface at the top side and/or the surface at the bottom side of the optoelectronic semiconductor chip are free of the shaped body.

BRIEF DESCRIPTION OF THE DRAWINGS

FIG. 1 is a sectional schematic illustration of an exemplary optoelectronic semiconductor component during a step of an exemplary method of producing the same.

FIG. 2 is a sectional schematic illustration of the exemplary optoelectronic semiconductor component depicted in FIG. 1 during a further step of the exemplary method.

DETAILED DESCRIPTION

Figure 3:
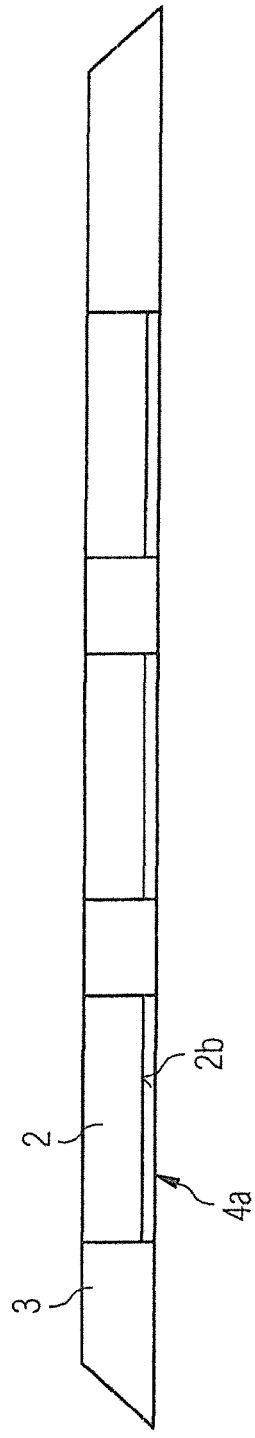
FIG. 3 is a sectional schematic illustration of the exemplary optoelectronic semiconductor component depicted in FIG. 2 during a further step of the exemplary method.

We provide a method of producing an optoelectronic semiconductor component. The optoelectronic semiconductor component is, for example, a light emitting diode that emits electromagnetic radiation. Alternatively, the optoelectronic semiconductor component can also be a photodiode provided for detecting electromagnetic radiation.

A carrier may first be provided. The carrier is a temporary carrier removed again in a final method step. The carrier can be, for example, a foil, a circuit board or generally a plate which is formed with a plastics material, a metal, a ceramic material or a semiconductor material.

At least one optoelectronic semiconductor chip may be arranged on the carrier at a top side of the carrier. The optoelectronic semiconductor chip is, for example, a light emitting diode chip or a photo diode chip. Furthermore, the optoelectronic semiconductor chip can be a laser diode chip. The at least one optoelectronic semiconductor chip is preferably fixed on the carrier to produce a mechanical connection between the optoelectronic semiconductor chip and the carrier, which later can be released nondestructively for the optoelectronic semiconductor chip. In other words, a sacrificial layer is arranged between the semiconductor chip and the carrier. The optoelectronic semiconductor chip can be fixed on the carrier by an adhesive, for example.

Preferably, a multiplicity of optoelectronic semiconductor chips are fixed on the carrier. The arrangement composed of the carrier and the multiplicity of optoelectronic semiconductor chips is then a so-called "artificial" wafer wherein a multiplicity of optoelectronic semiconductor chips preferably of the same type are arranged on a common carrier.

A shaped body may be shaped around the at least one optoelectronic semiconductor chip, preferably the multiplicity of optoelectronic semiconductor chips, wherein the shaped body covers all side areas of the at least one optoelectronic semiconductor chip. In other words, the at least one optoelectronic semiconductor chip is enveloped by the shaped body. The shaping-around or enveloping process can be effected, for example, by injection molding, casting, printing, lamination of a foil or the like. The shaped body is formed from a mechanically stabilizing material such as, for example, a plastic, a glass having a low melting point or a glass ceramic having a low melting point. The shaped body can, for example, contain epoxy resin, silicone, epoxy-silicon hybrid material, glass or glass ceramic or consist of one of these materials.

The shaped body is applied on the carrier such that it covers that surface of the carrier which faces the at least one optoelectronic semiconductor chip, and is in direct contact with the surface. Furthermore, the shaped body is in direct contact at least in places with the side areas running, for example, transversely or perpendicularly with respect to the surface of the carrier. In this case, it is possible for all side areas of the at least one semiconductor chip to be completely covered by the shaped body. However, it is also possible for the semiconductor chips to be covered by the shaped body only up to a specific height at the side areas and for parts of the at least one semiconductor chip to project from the shaped body such that the side areas of the at least one optoelectronic semiconductor chip are free of the shaped body in places. Furthermore, it is also possible for the shaped body to completely cover the semiconductor chips at their exposed areas. That is to say that a surface of the at least one optoelectronic semiconductor chip which faces away from the carrier can also be covered by the shaped body.

The carrier may be removed. That is to say that after the process of shaping around the at least one optoelectronic semiconductor chip, the carrier is removed from the composite assembly composed of shaped body and optoelectronic semiconductor chip. Removal, can be effected, for example, by heating or thinning the carrier. Heating can be effected by a laser beam, for example. Thinning can be effected by grinding back the carrier, for example. Furthermore, it is possible for removal to be effected by chemical stripping or stripping the carrier or the adhesion layer present, if appropriate, on the carrier. After the carrier has been removed, the underside of the at least one optoelectronic semiconductor chip, the underside originally facing the carrier, is freely accessible. The underside can also be the emission side of the semiconductor chip through which radiation emerges from the semiconductor chip during the operation thereof. In other words, the semiconductor chip is then applied "face-down" onto the carrier. All side areas of the at least one optoelectronic semiconductor chip are covered by the shaped body at least in places. That is to say that after the removal of the carrier, the shaped body constitutes a mechanically stabilizing body which surrounds the at least one optoelectronic semiconductor chip at its side areas and connects, if present, a multiplicity of optoelectronic semiconductor chips to one another.

The method of producing an optoelectronic semiconductor component comprises:
  providing a carrier;
  arranging at least one optoelectronic semiconductor chip at a top side of the carrier;
  shaping a shaped body around the at least one optoelectronic semiconductor chip wherein the shaped body covers all side areas of the at least one optoelectronic semiconductor chip; and
  removing the carrier.

In this case, the method steps described are preferably carried out in the order specified.

A multiplicity of optoelectronic semiconductor chips may be arranged at the top side of the carrier, wherein each of the semiconductor chips is provided during operation to generate electromagnetic radiation in a wavelength range having a peak wavelength assigned to the semiconductor chip. That is to say that each of the semiconductor chips is suitable for generating electromagnetic radiation. In this case, the semiconductor chip generates electromagnetic radiation in a specific wavelength range during operation. The electromagnetic radiation generated has a maximum in the wavelength range at a specific wavelength, the peak wavelength. In other words, the peak wavelength is the dominant wavelength of the electromagnetic radiation generated by the semiconductor chip during operation.

In this case, the peak wavelength of each of the semiconductor chips deviates from an average value of the peak wavelengths of all the optoelectronic semiconductor chip by at most +/−2%. That is to say that the optoelectronic semiconductor chips are optoelectronic semiconductor chips which emit electromagnetic radiation at the same or similar wavelengths. Preferably, the peak wavelength of each of the semiconductor chips deviates from an average value of the peak wavelengths of all the optoelectronic semiconductor chips at most by +/−1%, particularly preferably by at most +/−0.5%.

In other words, the optoelectronic semiconductor chips arranged on the carrier are presorted with regard to their emission wavelength. Those optoelectronic semiconductor chips which scarcely differ from one another or do not differ from one another at all in terms of their peak wavelength are arranged jointly on the carrier.

By way of example, the optoelectronic semiconductor chips are sorted with regard to their peak wavelength after their production (so-called "binning"). Those optoelectronic semiconductor chips which are classified into a common group during this sorting are arranged on the carrier.

A common phosphor layer may be disposed downstream of the optoelectronic semiconductor chips at their top side or their underside before or after the shaping-around process. In this case, "common phosphor layer" means that a phosphor layer having the same or similar properties is disposed downstream of all the optoelectronic semiconductor chips. That is to say that the phosphor layer of all the optoelectronic semiconductor chips consists, for example, of the same material and has the same thickness.

The phosphor layer contains or consists of a phosphor provided absorb the electromagnetic radiation generated by the semiconductor chips during operation and which re-emits electromagnetic radiation in a different wavelength range than the optoelectronic semiconductor chips. By way of example, the optoelectronic semiconductor chips generate blue light during operation and yellow light is re-emitted by the phosphor of the phosphor layer, the yellow light mixing with the blue light to form white light. The phosphor layer can be applied, for example, in the form of phosphor particles introduced in a matrix material such as, for example, silicone or ceramic. Furthermore, the phosphor layer can be applied as a ceramic lamina, which contains the phosphor or consists of a ceramic phosphor, to that surface of the semiconductor chips which faces away from the carrier. In this case, it is possible for the phosphor layer to be applied directly to that surface of the optoelectronic semiconductor chips which faces away from the carrier.

Particularly preferably, the optoelectronic semiconductor chips, as just described, are similar optoelectronic semiconductor chips which scarcely differ or do not differ from one another at all with regard to their peak wavelength. Advantageously, a common phosphor layer can be disposed downstream of these similar optoelectronic semiconductor chips. On account of the similarity of the optoelectronic semiconductor chips and the common phosphor layer, the optoelectronic semiconductor chips emit during operation mixed light having similar or identical properties. Unlike otherwise customary production of optoelectronic semiconductor components, therefore, it is not necessary for an appropriate phosphor layer to be disposed downstream of each optoelectronic semiconductor chip such that a desired mixed radiation composed of the electromagnetic radiation emitted directly by the optoelectronic semiconductor chip and the electromagnetic radiation re-emitted by the phosphor layer is established.

The top side, facing away from the carrier, of the at least one semiconductor chip may be freed of the shaped body or it remains free of the shaped body. That is to say that the shaped body is either applied such that that the surface of the at least one semiconductor chip which faces away from the carrier is not covered with the material of the shaped body. Alternatively, the shaped body can be removed again from the top side of the semiconductor chips after the shaped body has been applied. By way of example, the phosphor layer can then be applied to the surface free of the shaped body.

However, it is also possible for the semiconductor chips to be fixed onto the carrier by their emission side. Upon removal of the carrier, the surface facing the carrier, that is to say the underside, is exposed. In this variant of the method, at least one connection contact can be situated on the emission side of each of the semiconductor chips.

At least one plated-through hole with an electrically conductive material may be produced before or after the shaping-around process for each semiconductor chip. The plated-through hole is laterally spaced apart from the assigned semiconductor chip. That is to say that in a direction running, for example, parallel to the surface of the carrier which is assigned to the semiconductor chips, a plated-through hole is produced at a distance from the semiconductor chip. In this case, the plated-through hole completely penetrates through the shaped body and extends from a top side of the shaped body to an underside of the shaped body. After the conclusion of the method, that is to say after the removal of the carrier, the plated-through hole is freely accessible at least at the underside of the shaped body. At the top side of the shaped body, the plated-through hole can be covered by the phosphor layer.

Before the shaped body is shaped around, the plated-through hole can be produced by contact pins, for example, which are arranged at the top side of the carrier between the semiconductor chips before the shaping-around process. In this case, the contact pins are formed from an electrically conductive material such as copper, for example. In this case, the contact pins can also be formed integrally with the carrier. That is to say that a substrate with plated-through holes present is used as the carrier. Furthermore, the carrier can also be a leadframe.

Alternatively, it is possible for the plated-through holes to be produced by the production of cutouts in the shaped body after the process of shaping around the semiconductor chip. By way of example, by laser drilling or other types of material removal, it is possible to produce holes in the shaped body which completely penetrate through the shaped body and extend from the top side thereof to the underside thereof. These holes are then filled with a conductive material. The conductive material can be, for example, a plating, a solder material or a conductive adhesive.

An electrically conductive connection may be produced between the plated-through hole and the assigned semiconductor chip. In this case, the electrically conductive connection is electrically conductively connected to the surface facing away from the carrier at the top side of the semiconductor chip and extends along the top side of the shaped body. The electrically conductive connection is in electrically conductive contact, for example, with a bonding pad at the top side of the assigned semiconductor chip and extends as far as the plated-through hole. In this case, the connection extends at the top side of the shaped body either on the outer area of the shaped body or closely beneath the outer area of the shaped body. The electrically conductive connection can be produced by sputtering, photolithography, plating and/or etching-back. Furthermore, it is possible, for the purpose of producing the electrically conductive connection, for insulation material and metal to be applied by printing, to be applied as a metal paste by a sintering method (particularly if the shaped body is formed from a ceramic material), to be applied as conductive adhesive, or the like. Thus, it is also possible, for example, for the electrically conductive connections to be applied by an injection-molding method. That is to say that the electrically conductive connections are then applied in the manner of a "molded interconnected device" (MID).

The production of plated-through holes and assigned electrically conductive connections is advantageous if the optoelectronic semiconductor chips have electrically conductive contact locations at their top side and underside facing away from the top side. Alternatively, the use of flip-chip semiconductor chips is possible, having electrical contact locations only at one side, either the underside or the top side. The through-plating through the shaped body can be obviated in this case.

Furthermore, an optoelectronic semiconductor component is specified. The optoelectronic semiconductor component can preferably be produced by one of the methods described here. That is to say that all the features disclosed for the method are also disclosed for the optoelectronic semiconductor component, and vice versa.

The optoelectronic semiconductor component may comprise an optoelectronic semiconductor chip, the side areas of which are covered by a shaped body. In this case, the side areas are those areas which run transversely with respect to the outer area of the optoelectronic semiconductor chip at its top side and its underside and connect these outer areas to one another. In this case, the side areas can be completely covered by the shaped body. Furthermore, it is also possible for the side areas to be covered by the shaped body only up to a specific height. By way of example, the optoelectronic semiconductor chip can be a semiconductor chip in which semiconductor layers are deposited epitaxially onto a substrate. It is then possible for the side areas of the semiconductor chip to be covered such that the epitaxially produced layers are free of the shaped body. The epitaxially produced layers can then be covered by a further material, for example, by a printing process, or remain free.

The optoelectronic semiconductor component may comprise at least one plated-through hole comprising an electrically conductive material. The electrically conductive material is, for example, a metal or an electrically conductive adhesive.

The component may comprise an electrically conductive connection electrically conductively connected to the semiconductor chip and the plated-through hole. The electrically conductive connection is formed, for example, with a metal or an electrically conductive adhesive.

The plated-through hole may be laterally spaced apart from the semiconductor chip. In this case, the lateral direction is that direction which runs transversely or perpendicularly with respect to the side areas of the optoelectronic semiconductor chip. That is to say that the plated-through hole is arranged laterally with respect to the semiconductor chip and runs, for example, parallel or substantially parallel to a side area of the optoelectronic semiconductor chip. In this case, the plated-through hole preferably completely penetrates through the shaped body and extends from a top side of the shaped body to an underside of the shaped body. In this case, it is possible for the plated-through hole to be freely accessible at the top side and the underside of the shaped body.

Electrically conductive connection may extend at the top side of the shaped body. That is to say that the electrically conductive connection connects the semiconductor chip to the plated-through hole and in this case runs between semiconductor body and plated-through hole at the top side of the shaped body. In this case, the electrically conductive connection can be arranged on an outer area of the shaped body.

The optoelectronic semiconductor component may comprise an optoelectronic semi-conductor chip, the side areas of which are covered by a shaped body. Furthermore, the opto-electronic semiconductor component comprises at least one plated-through hole which comprises an electrically conductive material and an electrically conductive connection electrically conductively connected to the semiconductor chip and the plated-through hole. In this case, the plated-through hole is laterally spaced apart from the semiconductor chip and penetrates through the shaped body completely. The plated-through hole extends from a top side of the shaped body to an underside of the shaped body and the electrically conductive connection extends at the top side of the shaped body from the semiconductor chip to the plated-through hole.

The shaped body may be optically reflective. This can be achieved, for example, by introducing particles that reflect electromagnetic radiation, in particular light, into a matrix material of the shaped body. Electromagnetic radiation that emerges at the side areas of the optoelectronic semiconductor chip can then be reflected by the shaped body. In this case, the shaped body does not cover the optoelectronic semiconductor chip at the top side thereof at least in places. The particles are formed, for example, with at least one material or contain at least one material selected from the group consisting of $TiO_2$, $BaSO_4$, ZnO and $Al_xO_y$. It proves to be particularly advantageous if the shaped body contains silicone or consists of silicone and the particles consist of titanium oxide.

Preferably, the particles are introduced into the shaped body in a concentration such that the latter appears white.

Furthermore, it is possible for the shaped body to be radiation-transmissive. This is particularly advantageous for optoelectronic semiconductor chips which emit a large proportion of their electromagnetic radiation through the side areas.

The semiconductor component may comprise a multiplicity of semiconductor chips electrically conductively connected to one another by electrically conductive connections extending at the top side of the shaped body. By way of example, the semiconductor chips can be connected in series or in parallel by the electrically conductive connections. The semiconductor chips are in each case covered by the shaped body at their side areas. The shaped body constitutes a connection material to which the electrically conductive semiconductor chips are connected to form the optoelectronic semiconductor component.

The method described here and also the optoelectronic semiconductor component described here are explained in greater detail below on the basis of examples and the associated figures.

Elements that are identical, of identical type or act identically are provided with the same reference symbols in the figures. The figures and the size relationships of the elements illustrated in the figures among one another should not be regarded as to scale, but rather, individual elements may be illustrated with an exaggerated size to enable better illustration and/or to afford a better understanding.

A first method step of producing an optoelectronic semiconductor component is explained in greater detail on the basis of the schematic sectional illustration in FIG. 1. In the method, a carrier 1 is first provided. The carrier 1 is, for example, a carrier formed with a metal such as copper or aluminum, with a ceramic, with a semiconductor material or with a plastic. A multiplicity of optoelectronic semiconductor chips 2 are arranged at the top side 1a of the carrier 1, the chips being light emitting diode chips. The semiconductor chips 2 are fixed to the carrier 1 by a connection means 5. The connection means 5 is an adhesive, for example. In this case, the underside 2b of the semiconductor chips 2 faces the top side 1a of the carrier 1. A contact location 4a provided for making electrical contact with the semiconductor chip 2 is situated at the underside 2b of the semiconductor chips 2. By way of example, the contact location 4a is a metalization at the underside 2b of the semiconductor chip 2. A radiation exit area of the semiconductor chip 2 can comprise the side areas 2c and the outer area at the top side 2a.

In this case, it is possible for a contact location 4a to be situated at the top side 2a and a contact location 4b to be situated at the underside 2b. Furthermore, both contact locations 4a, 4b can be situated at the same side. Furthermore, it is possible for the underside 2b or the top side 2a to be the emission side of the semiconductor chip 2. That is to say that the radiation exit area of the semiconductor chip 2 can comprise the side areas 2c and the outer area at the top side 2a and/or the underside 2b.

A further method step is explained in conjunction with FIG. 2. In this method step, a shaped body 3 is applied, for example, by injection molding a molding compound such that the side areas 2c of the semiconductor chips 2 are covered by the shaped body and the shaped body connects the semiconductor chips 2 to one another. In this case, the underside 3b of the shaped body is in direct contact with the carrier 1 or the connection means 5 at the top side 1a of the carrier 1. The shaped body 3 can, at its top side 3a, terminate flush with the surface at the top side 2a of the semiconductor chip 2. Furthermore, it is possible for the shaped body 3, in contrast to the illustration in FIG. 2, to cover the side areas 2c of the semiconductor chips 2 only up to a specific height and for the semiconductor chips 2 to project beyond the shaped body 3 at the top side 3a thereof.

The shaped body 3 can be radiation-transmissive, for example, transparent, radiation-absorbent or reflective.

In the method step explained in conjunction with FIG. 3, the carrier 1 together with the connection means layer 5 optionally present is detached from the shaped body and the semiconductor chips 2. There remains a composite assembly composed of semiconductor chips 2 connected to one another by the shaped body 3. At the underside 2b of the semiconductor chips 2, the contact location 4a and also the radiation passage area, in the case of a "face-down" arrangement, is exposed.

Figure 4:
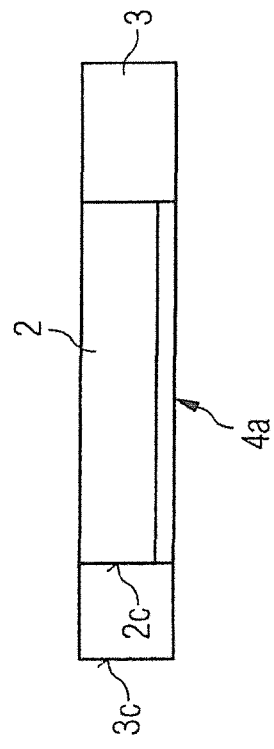
FIG. 4 is a sectional schematic illustration of an exemplary optoelectronic semiconductor component.
Figure 5:
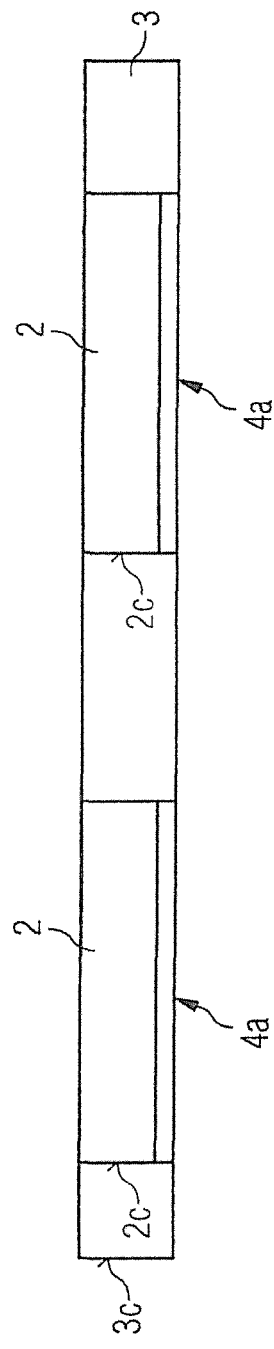
FIG. 5 is a sectional schematic illustration of a further exemplary optoelectronic semiconductor component.

In a further method step, illustrated schematically in FIGS. 4 and 5, the composite assembly of the semiconductor chips 2 can be singulated to form individual optoelectronic semiconductor components comprising one or more semiconductor chips 2. The singulation produces side areas 3c of the shaped body which have traces of material removal. By way of example, the side areas 3c can have sawing grooves or grinding tracks which originate from the singulation of the shaped body 3. Each of the semiconductor chips 2 is covered by the shaped body 3 at least in places at its side areas 2c.

Figure 6:
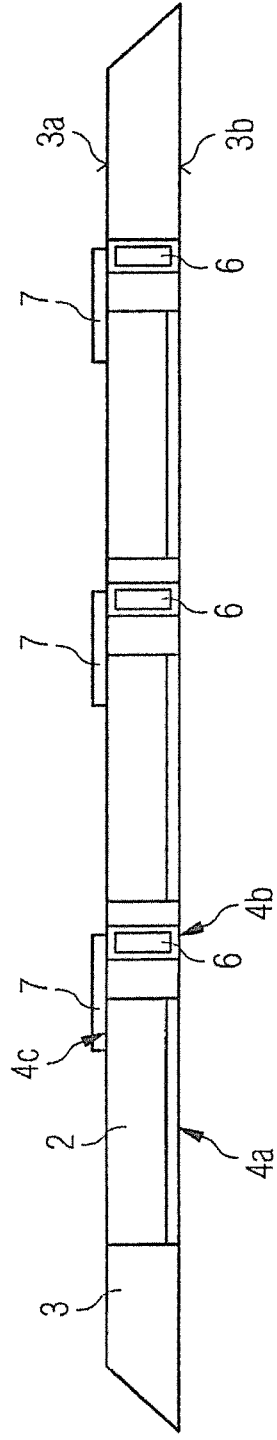
FIG. 6 is a sectional schematic illustration of an exemplary optoelectronic semiconductor component during a further step of an exemplary method of producing the same.

A further method step is explained with reference to the schematic sectional illustration in FIG. 6, which step can be carried out before or after the molding compound is shaped around the semiconductor chips 2 and before or after the carrier is removed. This method step involves producing plated-through holes 6 made from an electrically conductive material which penetrate through the shaped body 3 from the top side 3a thereof to the underside 3b thereof. The plated-through holes 6 are laterally spaced apart from the semiconductor bodies 2. Each semiconductor body 2 is preferably assigned a plated-through hole. In this case, the assignment can also be one-to-one. Furthermore, it is possible for one plated-through hole 6 to be present for a plurality of semiconductor chips 2. After the plated-through hole 6 has been produced an electrically conductive connection 7 is formed at the top side 3a on the surface of the shaped body 3, which electrically conductive connects a contact location 4c of the semiconductor chip 2 to the plated-through hole 6. At the underside of the shaped body 3, the plated-through holes 6 are freely accessible and form there a contact location 4b for the semiconductor component.

Figure 7:
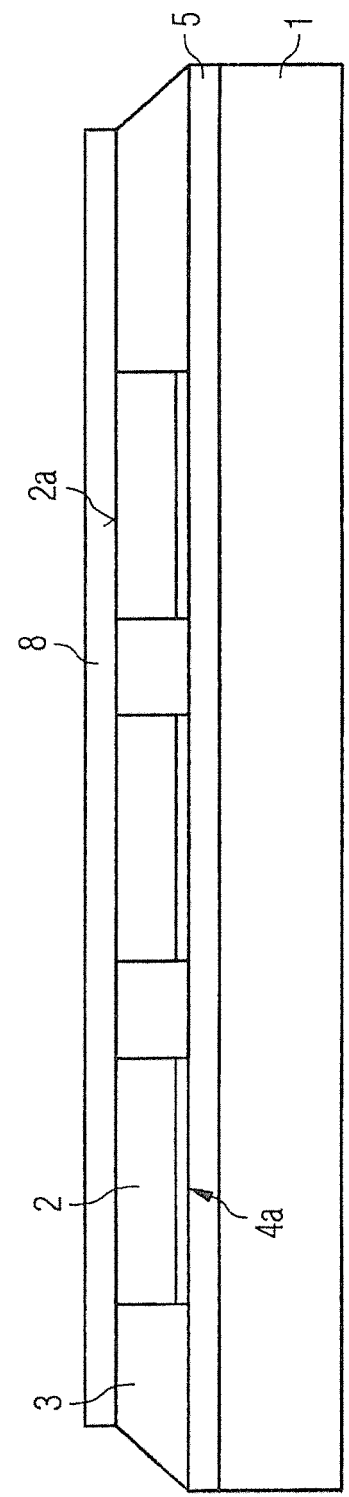
FIG. 7 is a sectional schematic illustration of an exemplary optoelectronic semiconductor component during another step of an exemplary method of producing the same.

A further method step is explained with reference to FIG. 7 in a schematic sectional illustration, which step can take place after the shaped body has been applied. In this method step, a phosphor layer 8 at the top side of the shaped body 3 is applied to the semiconductor chips 2 at their top side 2a. In this case, the phosphor layer 8 can be embodied continuously over all the semiconductor chips 2, as illustrated in FIG. 7. Furthermore, it is possible that a dedicated phosphor layer can be applied on each semiconductor chip 2. This can then also be effected before the molding compound is applied. The optoelectronic semiconductor chips in the example of FIG. 7 are preferably light emitting diode chips having a similar or identical emission characteristic, that is to say having a similar or identical peak wavelength as described further above. A uniform phosphor layer 8 is applied to the semiconductor chips 2. This results in optoelectronic semiconductor components having similar or identical emission characteristics. By way of example, the semiconductor components generate white light having a similar or identical color locus and/or having a similar or identical color temperature during operation.

Figure 8:
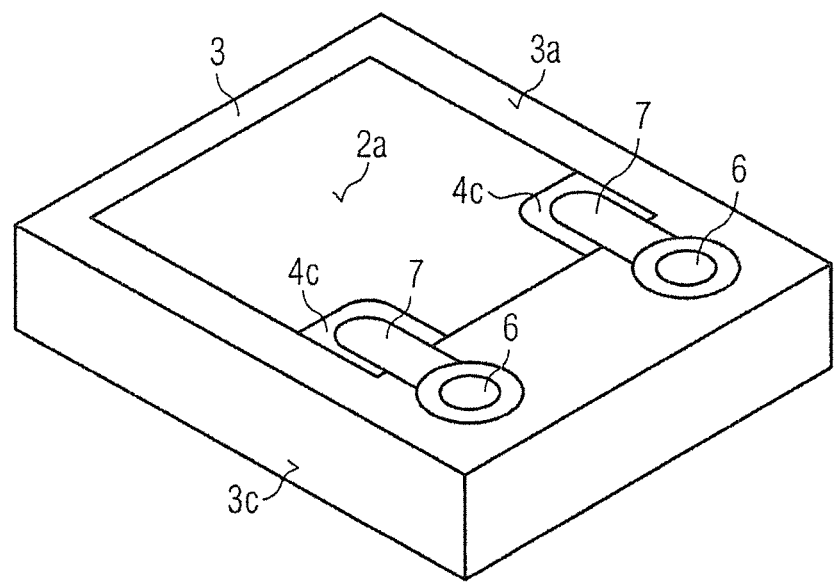
FIG. 8 is a schematic top perspective view of an exemplary optoelectronic semiconductor component.
Figure 9:
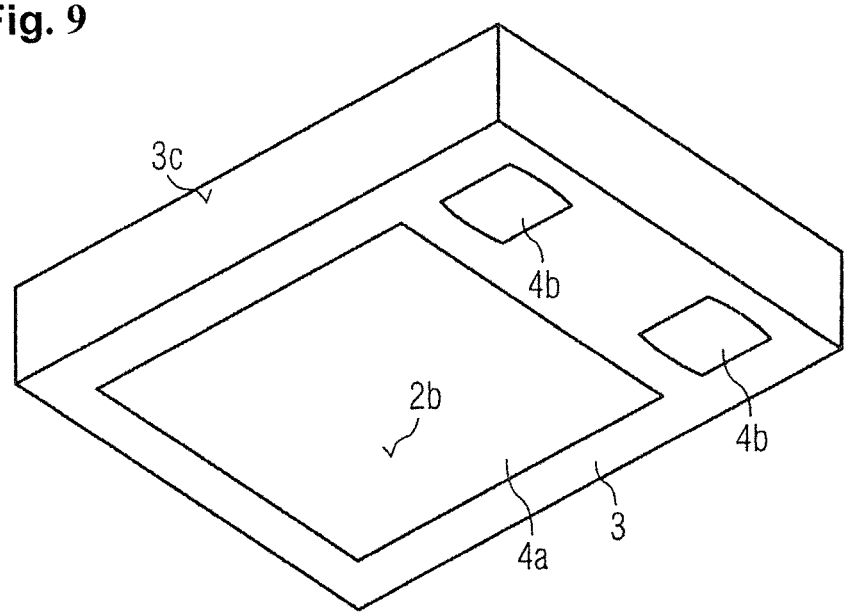
FIG. 9 is a schematic bottom perspective view of the exemplary optoelectronic semiconductor component depicted in FIG. 8.

FIGS. 8 and 9 show views of an optoelectronic semiconductor component described here in a schematic perspective illustration. FIG. 8 shows the semiconductor component from the top side 2a of the semiconductor chip 2. The semiconductor component comprises precisely one semiconductor chip 2, which is completely surrounded by the molding compound 3 at its side areas 2c. Plated-through holes 6 are led through the molding compound 3 and are connected by electrically conductive connections 7 to contact locations 4c at the top side 2a of the semiconductor chip 2. At the underside of the semiconductor component, see FIG. 9, a contact location 4a is formed so that the semiconductor chip 2 is contact-connected on the p-side, for example. The n-side contact-connection is then effected by the contact locations 4b formed by the plated-through holes 6. The shaped body 3 is likewise arranged between the plated-through holes 6 and the semiconductor chip 2, the shaped body electrically insulating the plated-through holes 6 from the semiconductor chip 2.

As an alternative to the example shown, the semiconductor chip 2 can also be a semi-conductor chip in which, for example, n- and p-side contacts are arranged jointly at the underside 2b of the semiconductor chip. The plated-through holes 6 can be dispensed with in this case.

Figure 10:
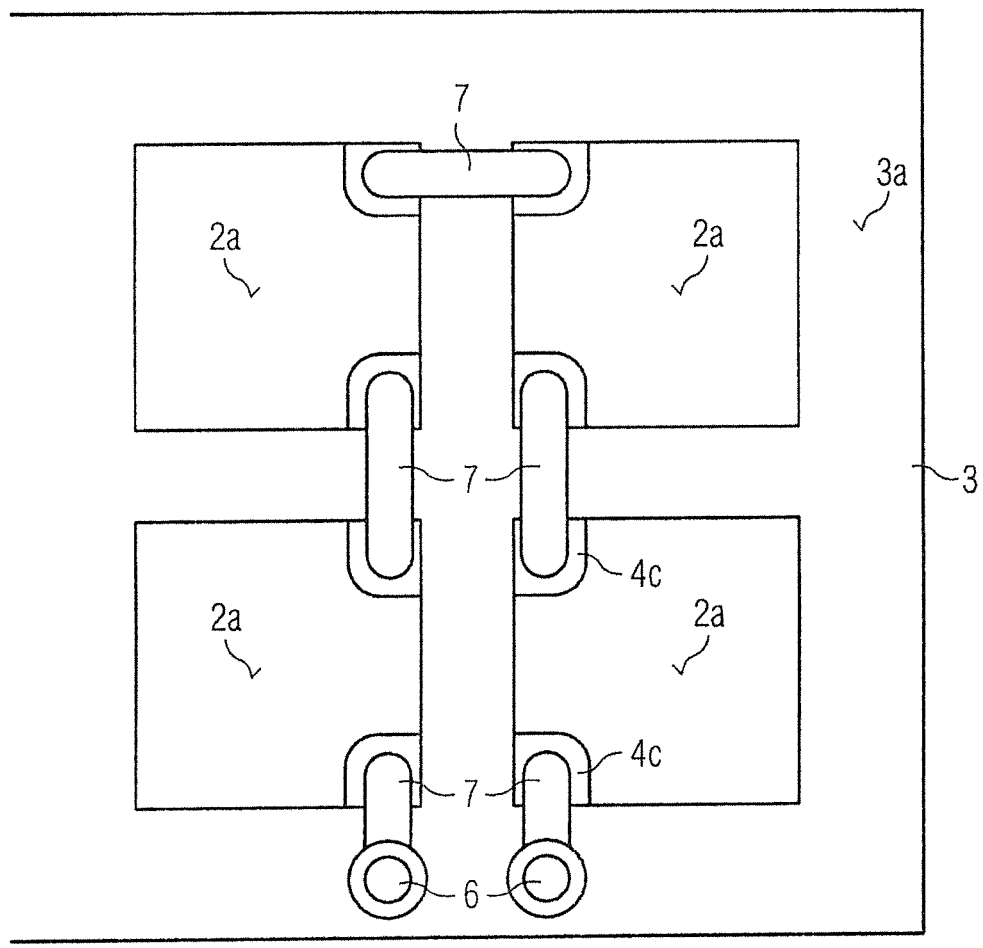
FIG. 10 is a schematic plan view of another exemplary optoelectronic semiconductor component.

FIG. 10 shows, on the basis of a schematic plan view, a further example of a semiconductor component described here. In this example, the semiconductor component comprises four semiconductor chips 2 connected to one another by the shaped body 3. The semiconductor chips 2 are electrically conductively connected to one another by electrically conductive connections 7 arranged at the top side 3a of the shaped body 3 and run, for example, on the outer area of the shaped body. The semiconductor chips are connected in series by the electrically conductive connections 7 and electrically contact-connected by contact locations 4b formed by the plated-through holes 6 and also contact locations 4a.

The method described here and the semiconductor components described here are distinguished, inter alia, by the following advantages: heat can be dissipated from the semiconductor components over the whole area via the entire underside 2 of the semiconductor chips 2.

Flip-chip contact-connection of the semiconductor component is possible via the plated-through holes 6. That is to say that a bonding wire, which is mechanically susceptible, can be obviated. On account of the fact that a multiplicity of semiconductor chips 2 can be surrounded with the shaped body 3 simultaneously, a particularly cost-saving method is involved.

The presorting of the optoelectronic semiconductor chips, for example, with regard to their peak wavelength enables a common phosphor layer 8 to be applied simultaneously to all the semiconductor chips, which are then distinguished by similar or identical emission characteristics.

Furthermore, a semiconductor component having an almost arbitrary number of semiconductor chips 2 can be produced in a flexible manner by the method. The area utilization of the semiconductor component is optimal.

Our methods and components are not restricted to the examples by the description on the basis of those examples. Rather, the disclosure encompasses any novel feature and also any combination of features, which, in particular, includes any combination of features in the appended claims, even if the feature or combination itself is not explicitly specified in the claims or examples.

The invention claimed is:

1. An optoelectronic semiconductor component comprising:
   an optoelectronic semiconductor chip having side areas,
   a surface at a top side of the optoelectronic semiconductor chip, and
   a surface at a bottom side of the optoelectronic semiconductor chip;
   a shaped body having a surface at a top side of the shaped body and a surface at an underside of the shaped body;
   at least one plated-through hole comprising an electrically conductive material; and
   an electrically conductive connection electrically conductively connected to the optoelectronic semiconductor chip and the plated-through hole, wherein
   an electrically conducting contact location is arranged at the bottom side of the optoelectronic semiconductor chip and covers the bottom side of the optoelectronic semiconductor chip at least in places,
   the side areas of the optoelectronic semiconductor chip are covered by the shaped body, and
   the surface at the bottom side of the optoelectronic semiconductor chip is completely free of the shaped body.

2. The optoelectronic semiconductor component according to claim 1, wherein the shaped body is radiation-absorbent.

3. The optoelectronic semiconductor component according to claim 1, wherein the shaped body is optically reflective and/or radiation-transmissive.

4. The optoelectronic semiconductor component according to claim 1, wherein the shaped body comprises a matrix material containing an epoxy resin or consists of an epoxy resin.

5. The optoelectronic semiconductor component according to claim 1, wherein the electrically conductive connection extends at the surface at the top side of the shaped body.

6. The optoelectronic semiconductor component according to claim 1, comprising a multiplicity of optoelectronic semiconductor chips electrically conductively connected to one another by electrically conductive connections extending at the top side of the shaped body.

7. The optoelectronic semiconductor component according to claim 1, wherein the shaped body does not project beyond the optoelectronic semiconductor chip in a vertical direction that runs along the side areas of the optoelectronic semiconductor chip.

8. The optoelectronic semiconductor component according to claim 1, wherein the contact location is freely accessible.

9. The optoelectronic semiconductor component according to claim 1, which is free of a carrier such that the plated-through hole is connectable at the top side and at the underside of the shaped body.

10. The optoelectronic semiconductor component according to claim 1, wherein the surface at the top side of the optoelectronic semiconductor chip is completely free of the shaped body.

11. An optoelectronic semiconductor component comprising:
    an optoelectronic semiconductor chip having side areas,
    a surface at a top side of the optoelectronic semiconductor chip, and a surface at a bottom side of the optoelectronic semiconductor chip;
    a shaped body having a surface at a top side of the shaped body and a surface at an underside of the shaped body;
    at least one plated-through hole comprising an electrically conductive material; and
    an electrically conductive connection electrically conductively connected to the optoelectronic semiconductor chip and the plated-through hole, wherein the side areas of the optoelectronic semiconductor chip are covered by the shaped body, and the shaped body covers the side areas of the optoelectronic semiconductor chip in such a way that the side areas of the optoelectronic semiconductor chip are free of the shaped body in places or the surface at the top side and the surface at the underside of the shaped body terminates flush with the surface at the top side and the surface at the bottom side of the optoelectronic semiconductor chip, respectively.

12. The optoelectronic semiconductor component according to claim 11, wherein the shaped body does not project beyond the optoelectronic semiconductor chip in a vertical direction that runs along the side areas of the optoelectronic semiconductor chip.

13. An optoelectronic semiconductor component comprising:
    an optoelectronic semiconductor chip having side areas,
    a surface at a top side of the optoelectronic semiconductor chip, and
    a surface at a bottom side of the optoelectronic semiconductor chip; and
    a shaped body having a surface at a top side of the shaped body and
    a surface at an underside of the shaped body, wherein
    the side areas of the optoelectronic semiconductor chip are covered by the shaped body, and the surface at the top side and/or the surface at the bottom side of the optoelectronic semiconductor chip are free of the shaped body, and
    the shaped body covers the side areas of the optoelectronic semiconductor chip in such a way that the side areas of the optoelectronic semiconductor chip are free of the shaped body in places or the surface at the top side and the surface at the underside of the shaped body terminates flush with the surface at the top side and the surface at the underside of the optoelectronic semiconductor chip, respectively.

14. The optoelectronic semiconductor component according to claim 13, wherein the shaped body does not project beyond the optoelectronic semiconductor chip in a vertical direction that runs along the side areas of the optoelectronic semiconductor chip.

\* \* \* \* \*